United States Patent
Noda

(10) Patent No.: US 11,832,453 B2
(45) Date of Patent: *Nov. 28, 2023

(54) SEMICONDUCTOR STORAGE DEVICE AND METHOD FOR PRODUCING SEMICONDUCTOR STORAGE DEVICE

(71) Applicant: KIOXIA CORPORATION, Tokyo (JP)

(72) Inventor: Kosei Noda, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/678,429

(22) Filed: Feb. 23, 2022

(65) Prior Publication Data

US 2022/0181333 A1    Jun. 9, 2022

Related U.S. Application Data

(63) Continuation of application No. 17/009,588, filed on Sep. 1, 2020, now Pat. No. 11,289,496.

(30) Foreign Application Priority Data

Sep. 19, 2019  (JP) ................. 2019-170525

(51) Int. Cl.
| | |
|---|---|
| *H01L 21/768* | (2006.01) |
| *H10B 69/00* | (2023.01) |
| *H01L 23/532* | (2006.01) |
| *H01L 23/522* | (2006.01) |
| *H01L 21/311* | (2006.01) |

(52) U.S. Cl.
CPC ....... *H10B 69/00* (2023.02); *H01L 21/76877* (2013.01); *H01L 21/31111* (2013.01);
(Continued)

(58) Field of Classification Search
CPC ............ H01L 27/115; H01L 21/76877; H01L 21/31111; H01L 21/76802; H01L 23/5226;
(Continued)

(56) References Cited

U.S. PATENT DOCUMENTS

| | | |
|---|---|---|
| 5,825,609 A | 10/1998 | Andricacos |
| 8,987,089 B1 | 3/2015 | Pachamuthu et al. |

(Continued)

FOREIGN PATENT DOCUMENTS

| | | |
|---|---|---|
| CN | 108431955 A | 8/2018 |
| JP | 2013069841 A | 4/2013 |

(Continued)

*Primary Examiner* — Karen Kusumakar

(74) *Attorney, Agent, or Firm* — Kim & Stewart LLP

(57) ABSTRACT

According to one embodiment, a semiconductor storage device includes a stacked body above a substrate. The stacked body includes a first stacked region in which a first insulating layer and a second insulating layer are alternately stacked and a second stacked region in which a conductive layer and the first insulating layer are alternately stacked. The semiconductor storage device includes a memory pillar that extends through the second stacked region of the stacked body in a stacking direction. The second insulating layer comprising a first insulating material within the first stacked region and a second insulating material on ends of the second insulating layer in a direction intersecting to the stacking direction.

18 Claims, 8 Drawing Sheets

(52) U.S. Cl.
CPC .... *H01L 21/76802* (2013.01); *H01L 23/5226* (2013.01); *H01L 23/53295* (2013.01)

(58) Field of Classification Search
CPC ......... H01L 23/53295; H01L 27/11573; H01L 27/11575; H01L 27/11582; H01L 27/11565; H01L 27/11524; H01L 27/11556; H01L 27/1157
See application file for complete search history.

(56) References Cited

U.S. PATENT DOCUMENTS

| | | | |
|---|---|---|---|
| 9,673,213 | B1 | 6/2017 | Yu et al. |
| 9,761,605 | B1 | 9/2017 | Sekine |
| 9,806,092 | B1 | 10/2017 | Minemura |
| 10,020,315 | B1 | 7/2018 | Kato et al. |
| 10,290,648 | B1 | 5/2019 | Zhou et al. |
| 10,304,852 | B1 | 5/2019 | Cui |
| 10,504,914 | B2 | 12/2019 | Wang |
| 2016/0163725 | A1 | 6/2016 | Kamiya |
| 2017/0162595 | A1 | 6/2017 | Kitahara |
| 2018/0076215 | A1 | 3/2018 | Nishimura |
| 2019/0006275 | A1 | 1/2019 | Kobayashi |
| 2019/0067314 | A1 | 2/2019 | Lu et al. |
| 2019/0139983 | A1 | 5/2019 | Lee et al. |
| 2020/0035702 | A1* | 1/2020 | Lee ..................... H10B 41/41 |

FOREIGN PATENT DOCUMENTS

| | | |
|---|---|---|
| TW | 201937709 A | 9/2019 |
| WO | 2019052127 A1 | 3/2019 |

* cited by examiner

SEMICONDUCTOR STORAGE DEVICE AND METHOD FOR PRODUCING SEMICONDUCTOR STORAGE DEVICE

CROSS-REFERENCE TO RELATED APPLICATIONS

This application is a continuation of U.S. patent application Ser. No. 17/009,588, filed on Sep. 1, 2020, which is based upon and claims the benefit of priority from Japanese Patent Application No. 2019-170525, filed on Sep. 19, 2019, the entire contents of each of which are incorporated herein by reference.

FIELD

Embodiments described herein relate generally to semiconductor storage devices and methods for producing a semiconductor storage device.

BACKGROUND

In a process of producing three-dimensional nonvolatile memory, such as three-dimensional NAND memory, a stacked body including conductive layers is formed by, for example, replacing a plurality of insulating layers with conductive layers.

In a region where a contact, which passes through the stacked body in the vertical direction thereof, is provided to establish an electrical connection, the insulating layers in such a region of the stacked body sometimes remain in the final device as insulating layers. That is, such insulating layers in such a contact region are not replaced with the conductive layers during device fabrication.

In this case, it is desirable to inhibit the removal and replacement of the insulating layers with conductive material in this region.

As one technique, a method has been proposed by which a silicon nitride (SiN) film is formed as an insulating layer to be replaced (sacrificial layer), but a silicon oxide film is then formed on the inside wall surfaces of slits by oxidizing the silicon nitride film. The slits are adjacent to or in the region through which a contact will later be passed. The formation of silicon oxide in this matter is intended to prevent removal of the remaining silicon nitride in the contact formation region.

However, with this method, it is difficult to make the protective oxide film very thick and thus there is a possibility that the SiN insulating layer will still be replaced, unintentionally, with conductive material in the contact formation region.

DETAILED DESCRIPTION

In general, according to one embodiment, a semiconductor storage device comprises a stacked body stacked above a substrate and a memory pillar. The stacked body includes a first stacked region in which a first insulating layer and a second insulating layer are alternately stacked on each other in a stacking direction and a second stacked region in which a conductive layer and the first insulating layer are alternately stacked on each other in the stacking direction. The memory pillar extends in the stacking direction through the second stacked region of the stacked body. Memory cells are at the intersections of the memory pillar and at least some of the conductive layers. The second insulating layer comprises a first insulating material within the first stacked region and a second insulating material on ends of the second insulating layer in a direction perpendicular to the stacking direction.

An example embodiment will be described with reference to the drawings. The present disclosure is not limited by this example.

Figure 1:
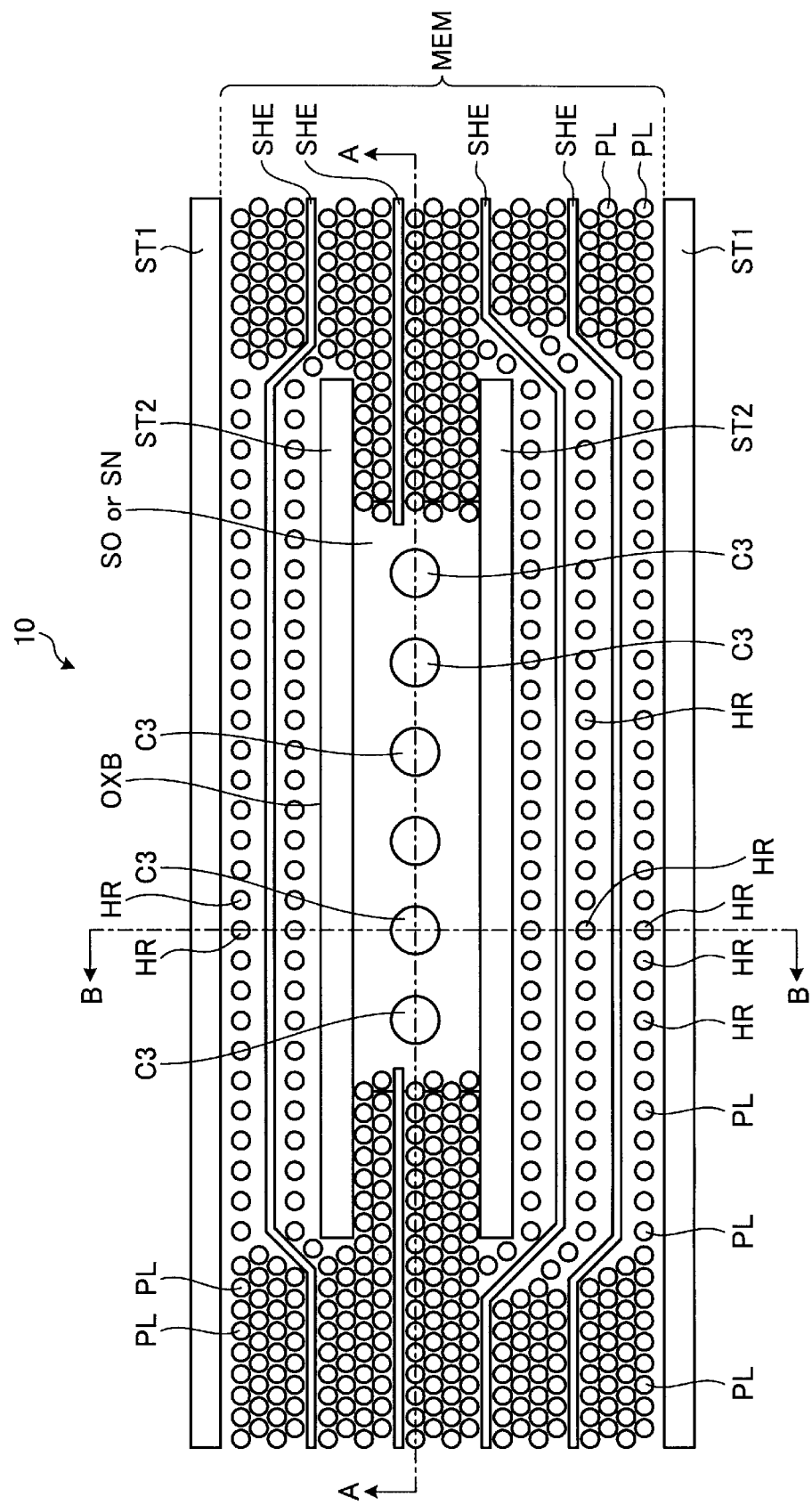
FIG. 1 is a schematic view of a semiconductor storage device according to an embodiment when viewed from above.

FIG. 1 is a schematic view of a semiconductor storage device according to an embodiment when viewed from above.

A semiconductor storage device 10 includes two first slits ST1, a memory region MEM between the two first slits ST1, two second slits ST2 between the two first slits ST1, an oxide-based region OXB between the two second slits ST2, and a gate isolation portion SHE.

The oxide-based region OXB can be used as a region through which a contact is passed in a vertical direction to establish electrical connection(s).

The first slit ST1 is used to introduce hot phosphoric acid or the like when a sacrificial layer SN is being removed (by the hot phosphoric acid or the like) during the production of the semiconductor storage device 10.

In the memory region MEM, memory cells MC are three-dimensionally arranged. The memory region MEM includes a plurality of cylindrical pillars PL.

Each pillar PL includes, in order from the outer periphery thereof, a memory layer, a channel layer, and a core layer. The memory layer includes, for example, a $SiO_2$ layer, a SiN layer, and a $SiO_2$ layer which are stacked. Moreover, as the channel layer, an amorphous silicon layer or a polysilicon layer, for example, is used. Furthermore, as the core layer, a $SiO_2$ layer, for example, is used.

Moreover, the oxide-based region OXB is placed in the central part of the memory region MEM. The oxide-based region OXB includes a sacrificial layer SN. The sacrificial layer SN is a layer that is replaced with a word line WL (for example, a conductive layer of tungsten or the like forms the word line(s) WL) in a production process. In the oxide-based region OXB, apart of the sacrificial layer SN remains without being replaced with the word line WL material. Silicon nitride (SiN), for example, is used in the sacrificial layer SN.

In the oxide-based region OXB, a plurality of contacts C3 are provided to connect a peripheral circuit below the memory region MEM to upper layer wiring and the like ultimately above the memory region MEM. In FIG. 1 six contacts C3 are depicted, but this is only an example and, in general, any number of contacts C3 may be provided.

The gate isolation portion SHE is provided for individual selection of a plurality of memory cells connected to the same bit line (is the bit lines are not shown in FIG. 1) and the same word line WL.

Figure 2:
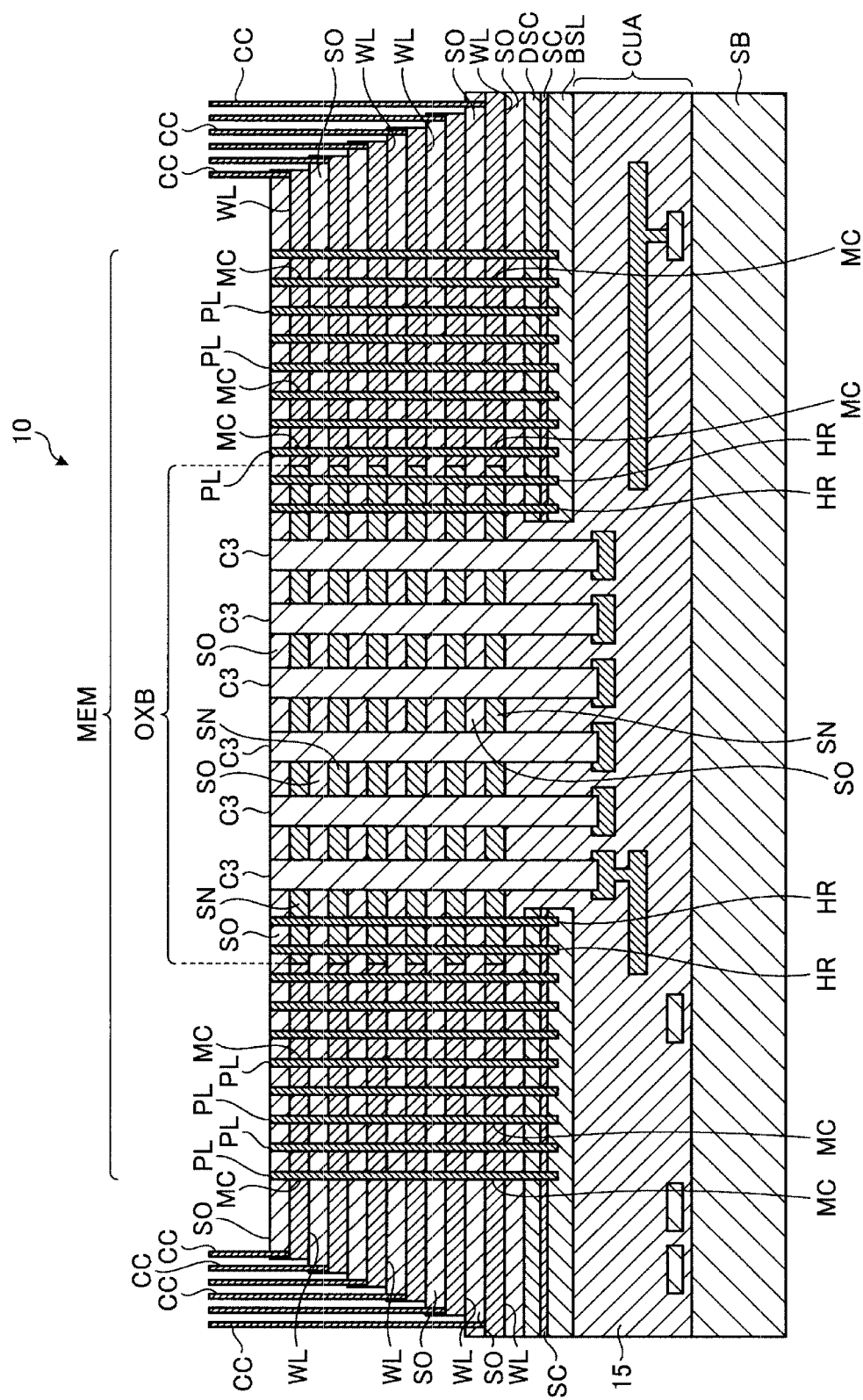
FIG. 2 is a cross-sectional view taken along the line A-A of FIG. 1.

FIG. 2 is a cross-sectional view taken along the line A-A, which is shown by arrows, of FIG. 1.

As shown in FIG. 2, the semiconductor storage device 10 includes a substrate SB, a peripheral circuit formation portion CUA, and the memory region MEM.

The substrate SB is a semiconductor substrate such as a silicon substrate.

The peripheral circuit formation portion CUA including a transistor TR, wiring, and the like is placed on the substrate SB.

The peripheral circuit formation portion CUA is provided below the memory region MEM. A peripheral circuit formed in the peripheral circuit formation portion CUA is a circuit that contributes to the operation of a memory cell array or a memory cell. The peripheral circuit is covered with an insulating layer 15.

On the insulating layer 15, a conductive layer BSL is placed.

A conductive layer DSC is placed above the conductive layer BSL with a conductive layer SC sandwiched therebetween.

Furthermore, on the conductive layer DSC, an insulating layer SO and the word line WL are alternately stacked, and, above the conductive layer DSC, a select gate line SG is provided. The conductive layer BSL and the conductive layer DSC are electrically connected via the conductive layer SC.

In the memory region MEM, a plurality of pillars PL and columnar portions HR that pass through the word lines WL in the direction in which the layers are stacked are placed. A plurality of memory cells MC are formed at the intersections of the pillars PL and the word lines WL.

When, for example, a predetermined voltage is applied from the word line WL and the charge is stored in the memory cell MC, data is written into the memory cell MC. Moreover, when a predetermined voltage is applied from the word line WL, the data written in the memory cell MC is read therefrom.

As described above, the semiconductor storage device 10 is configured as three-dimensional nonvolatile memory in which, for example, the memory cells MC are three-dimensionally placed.

As shown in FIG. 2, ends of the plurality of word lines WL are configured in a staircase pattern. At each end of each word line WL, a contact CC that connects the word line WL and upper layer wiring or the like is placed. This makes it possible to extend each of the word lines WL, which are stacked in multiple layers, to a part above the semiconductor storage device 10.

In the oxide-based region OXB, the word lines WL otherwise formed as a result of the replacement of the sacrificial layer SN with tungsten or the like are not present, and the sacrificial layer SN remains.

This allows the contacts C3 provided in the oxide-based region OXB to be formed through insulating material, that is surrounded by the insulating layers SO and the sacrificial layers SN, and to electrically connect the peripheral circuit(s) in the peripheral circuit formation portion CUA and an upper layer wiring or the like above the memory region MEM.

Figure 3:
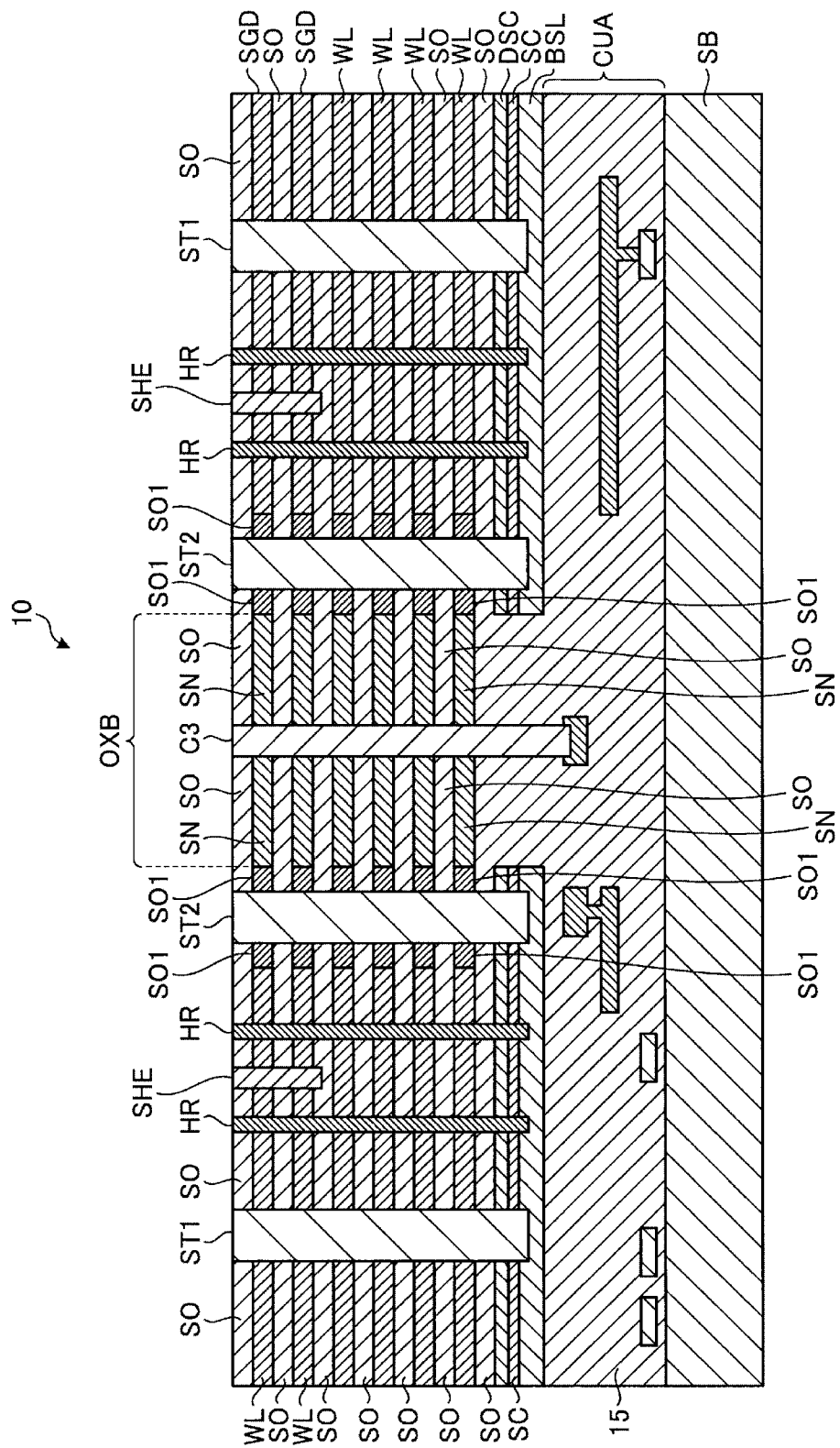
FIG. 3 is a cross-sectional view taken along the line B-B of FIG. 1.

FIG. 3 is a cross-sectional view taken along the line B-B, which is shown by arrows, of FIG. 1.

An insulating layer SO1 is formed in end face parts, which are side wall surfaces of the second slits ST2, of the sacrificial layers SN which are not yet replaced with the word lines WL.

This allows the sacrificial layers SN in the oxide-based region OXB between a pair of second slits ST2 to remain, which makes it possible for contacts C3 to be surrounded with insulating layers.

In this case, the distance from an inner wall surface of the second slit ST2 to an end face of the sacrificial layer SN or the distance from an inner wall surface of the second slit ST2 to an end face of the word line WL is about 15 nm.

That is, the horizontal thickness of the insulating layer SO1 is about 15 nm. Furthermore, from the viewpoint of improving any one of resistance to etching in a post-process and insulation performance as a product or both, the horizontal thickness of the insulating layer SO1 may be set around 20 nm to 25 nm.

Next, a method for producing the semiconductor storage device 10 of the embodiment will be described with reference to the drawings.

First, on the substrate SB, a peripheral circuit and wiring are formed by a commonly-used semiconductor production method and the peripheral circuit formation portion CUA including a CMOS circuit and the like is made.

Then, the insulating layer 15 is formed by depositing a silicon oxide film. On the insulating layer 15, the conductive layer BSL, a sacrificial layer (not separately illustrated), and the conductive layer DSC are formed.

Furthermore, the insulating layer SO including a silicon oxide film, for example, and the sacrificial layer SN that includes a silicon nitride film, for example, and functions as an insulating layer that is etched by an etchant (for example, phosphoric acid), which is used to etch the sacrificial layer SN, at a higher rate than a rate at which the insulating layer SO is etched thereby are alternately deposited more than once; a stacked structure is formed in this way and used as a stacked body.

A resist is then applied to the entire surface of the stacked body, and an unillustrated resist pattern having a pattern with openings in positions where the pillars PL are to be formed is formed using photolithography.

Then, by using anisotropic etching such as reactive ion etching (RIE), memory holes are formed, using the resist pattern as a mask, in positions where the pillars PL are to be formed. The memory holes are provided in such a way as to pass through the stacked body in the thickness direction thereof and reach the conductive layer BSL.

Next, a memory layer, a channel layer, and a core layer are formed on the inner surface of each memory hole. That is, as described earlier, this memory layer includes a block insulating film, a charge storage film, and a tunnel insulating film which are stacked in order.

The upper surfaces of the pillars PL are then covered using unillustrated mask material and resist, and an unillustrated resist pattern having a pattern with openings in positions where the columnar portions HR are to be formed is formed using photolithography.

Then, by using anisotropic etching such as RIE, holes are formed, using the resist pattern as a mask, in positions where the columnar portions HR are to be formed. The holes are provided in such a way as to pass through the stacked body in the thickness direction thereof and reach the conductive layer BSL.

Next, an insulating film and a conductive film are formed on the inner surface of each hole.

Then, the unillustrated sacrifice layer is removed using isotropic etching.

Furthermore, in a space from which the sacrifice layer was removed, a conductive layer is formed using, for example, polysilicon doped with impurities such as phosphorus. This allows a portion of the memory hole of the pillar PL, which eventually intersects the word line WL, to function as a memory cell.

On the other hand, the columnar portions HR function as support pillars that support the structure when the sacrifice layer SN is replaced with a conductive layer of tungsten or the like.

Then, an unillustrated resist is applied to the stacked body in which the pillars PL and the columnar portions HR are formed, and a resist pattern with openings for forming the first slits ST1 for replacement of an insulating layer and the second slits ST2 for formation of a protective film is formed using lithography and development.

Each opening for slit formation in the resist pattern is formed in the position and the shape shown in FIG. 1. In general, the openings for slit formation extend in the left-right direction in FIG. 1. The stacked body is then etched by anisotropic etching such as RIE using the unillustrated resist pattern as a mask and the first slits ST1 and the second slits ST2 are formed. The first slits ST1 and the second slits ST2 have sidewalls which are inclined with respect to the stacking direction. The first slits ST1 and the second slits ST2 reach the conductive layer BSL.

Figure 4:
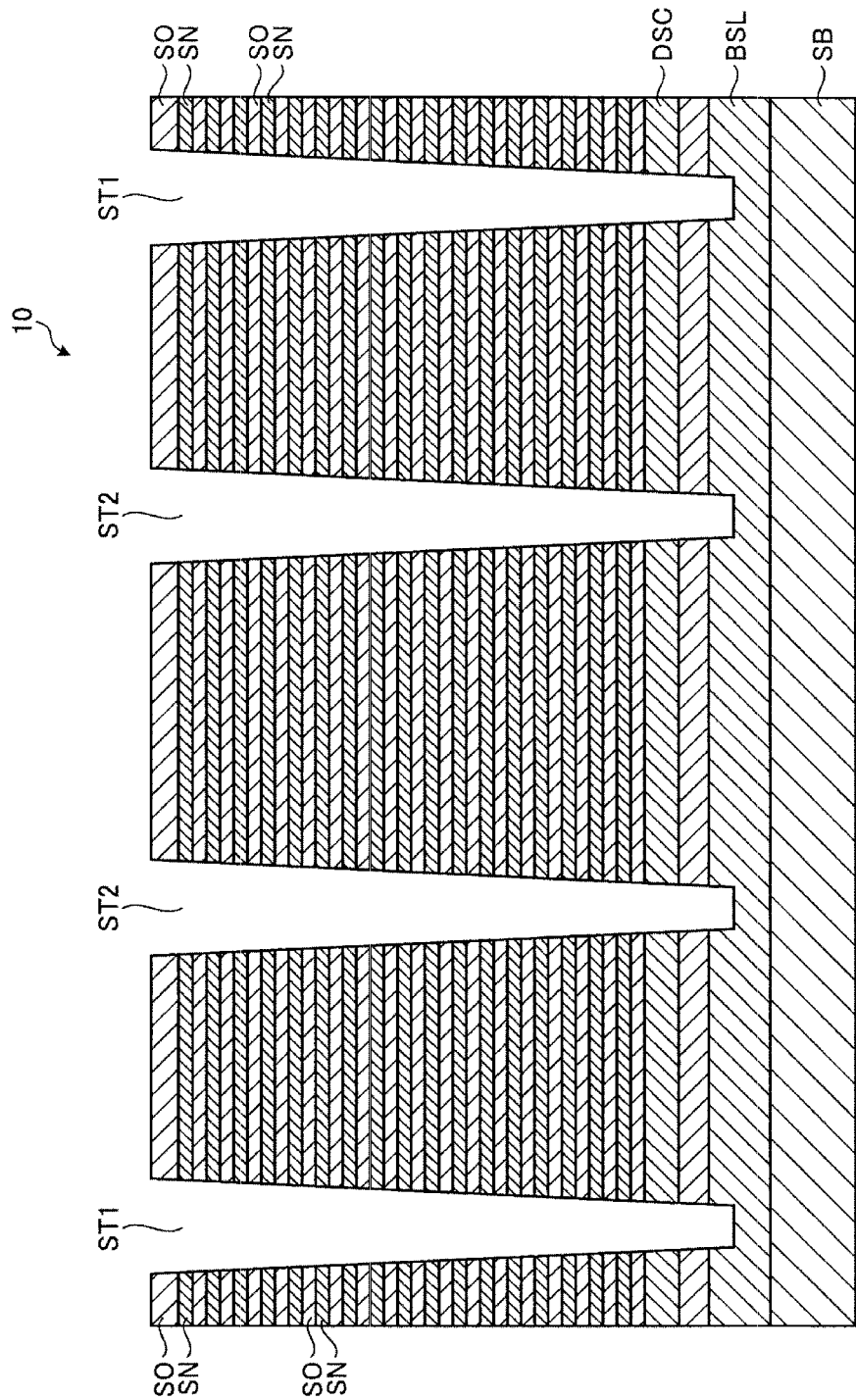
FIG. 4 depicts aspects of a method for producing a semiconductor storage device.

FIG. 4 depicts aspects of the method for producing the semiconductor storage device 10.

In FIG. 4, to facilitate understanding thereof, the first slits ST1, the second slits ST2, the insulating layers SO and the sacrificial layers SN in the stacked body, and the substrate SB are shown and some of the other components (for example, the memory holes, the contacts, and the peripheral circuit formation portion CUA) are not shown.

As shown in FIG. 4, in the semiconductor storage device 10, the first slits ST1 and the second slits ST2 of approximately the same depth are formed in such a way as to pass through the insulating layers SO and the sacrificial layers SN and reach the conductive layer BSL.

Figure 5:
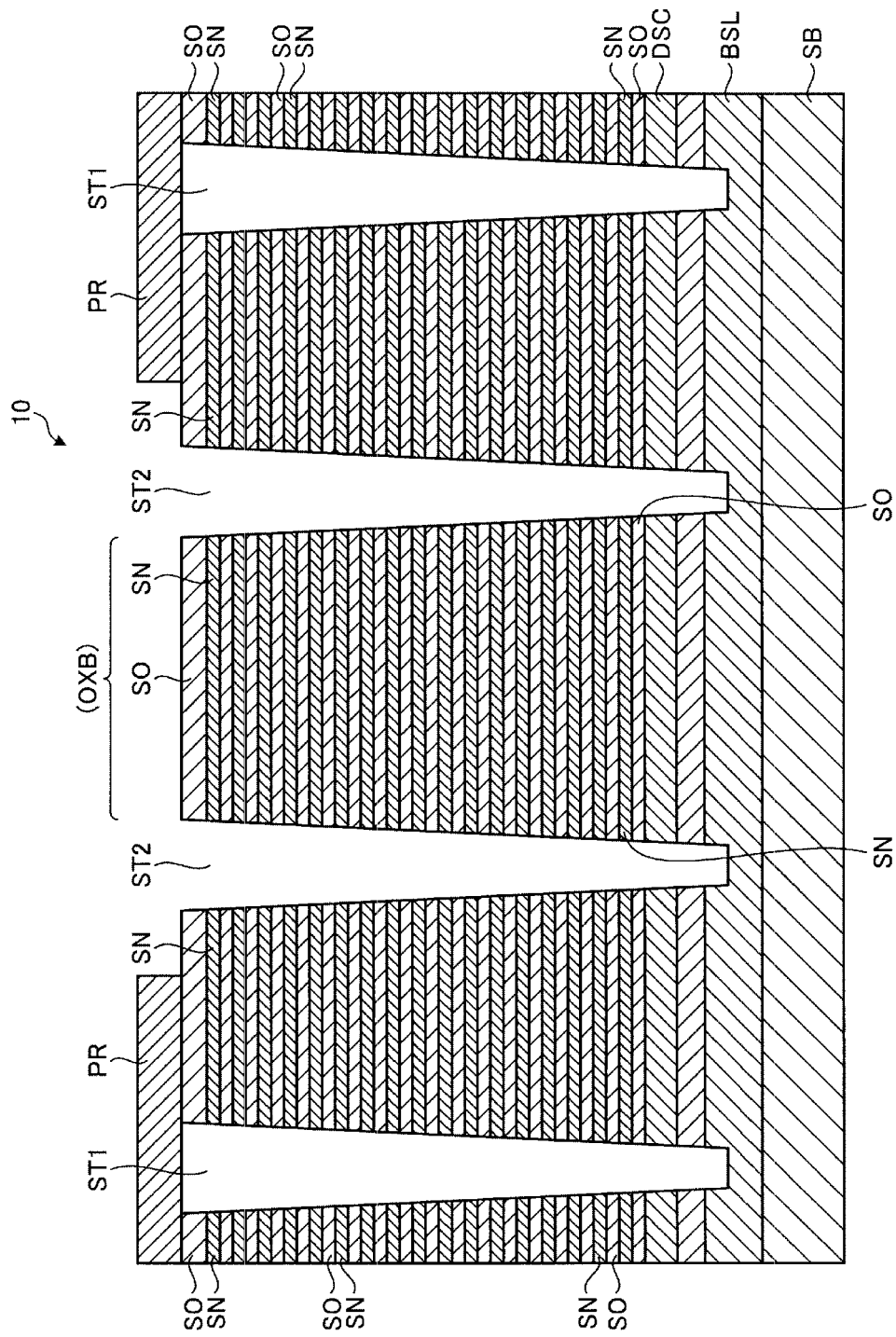
FIG. 5 depicts aspects of a method for producing a semiconductor storage device.

FIG. 5 depicts aspects of the method for producing the semiconductor storage device 10.

Next, as shown in FIG. 5, a resist pattern PR with openings corresponding in position to the portion which will be the oxide-based region OXB of the semiconductor storage device 10 and positions around the second slits ST2 is formed as a mask. Alternatively, a pattern with openings only around the second slits ST2 may be used.

Figure 6:
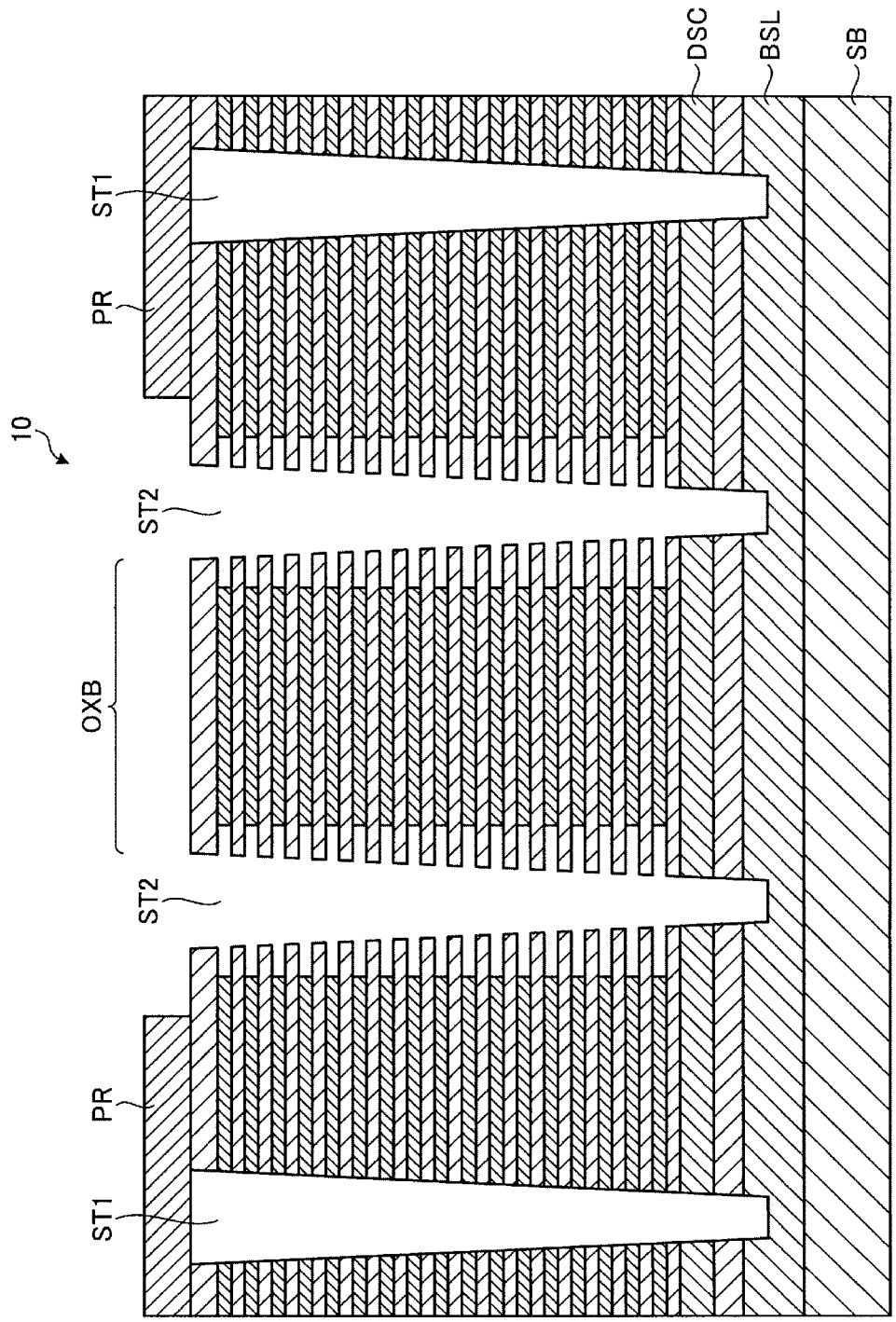
FIG. 6 depicts aspects of a method for producing a semiconductor storage device.

FIG. 6 depicts aspects of the method for producing the semiconductor storage device 10.

Next, as shown in FIG. 6, end faces of the sacrificial layers SN on the sides thereof where the inner wall surfaces of the second slits ST2 are located are etched by, for example, chemical dry etching (CDE) and recess portions (recesses) are formed.

In this case, the depth (in this context, the depth/recessing distance in the left-right direction in the example of FIG. 6, the left-right direction intersects the vertical direction) of each recess portion from the inner wall surface of the second slit ST2 is preferably about 80 nm with consideration given to the rate of subsequent etching of the sacrificial layers SN by hot phosphoric acid (hot $H_3PO_4$) and the amount of subsequent etching of a $SiO_2$ protective film which is formed on the end faces of the sacrificial layers SN in a portion in the oxide-based region OXB. The above depth only has to be set at a depth that is deep enough to prevent the sacrificial layers SN remaining in the oxide-based region OXB from being removed by the hot phosphoric acid with consideration given to a temperature or the like in an actual process.

Figure 7:
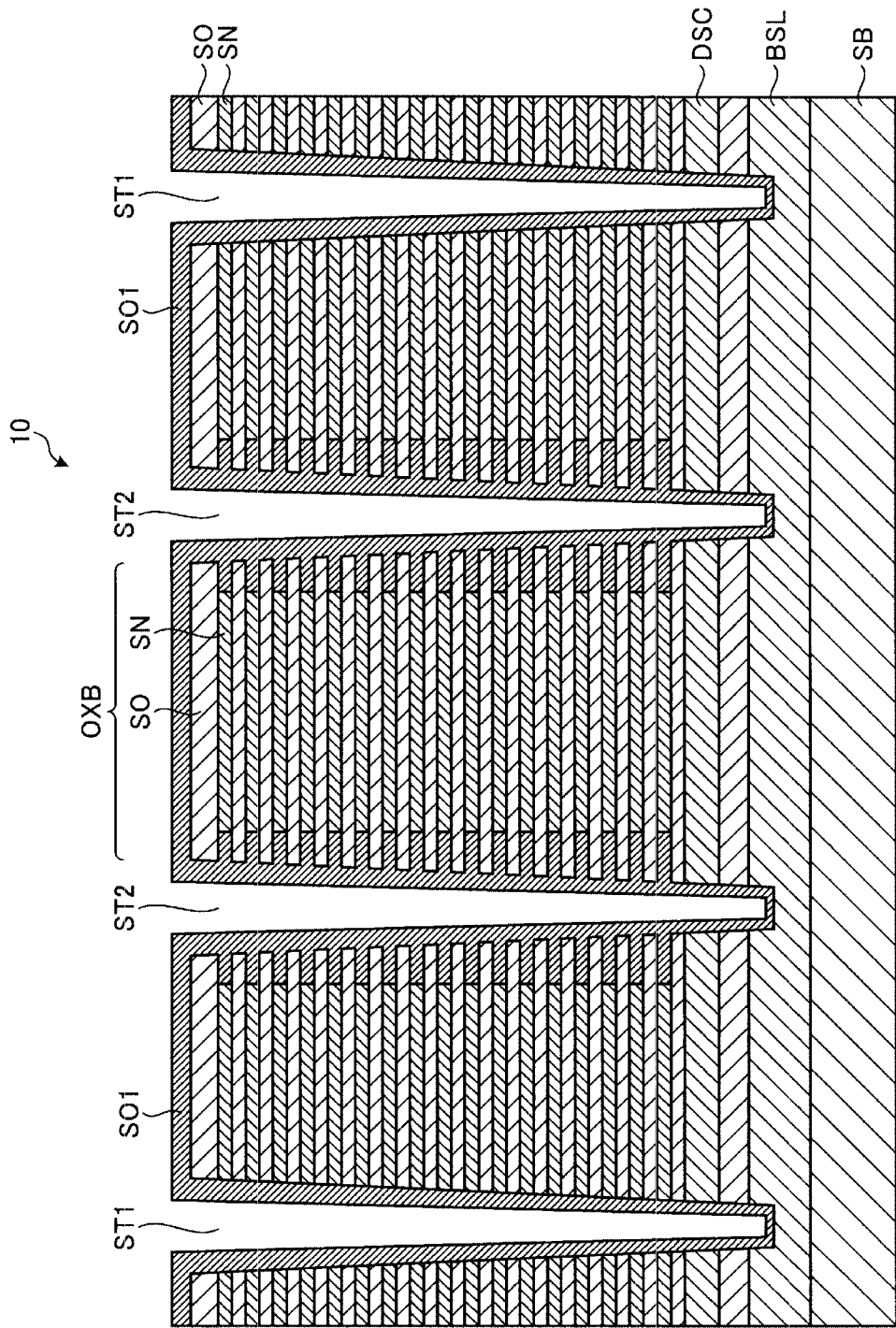
FIG. 7 depicts aspects of a method for producing a semiconductor storage device.

FIG. 7 depicts aspects of the method for producing the semiconductor storage device 10.

Then, as shown in FIG. 7, after the resist pattern PR is removed, the insulating layer SO1, which is a $SiO_2$ layer, is formed by plasma enhanced atomic layer deposition (PEALD) or the like.

In this case, it is preferable to provide a process of densification of the $SiO_2$ layer, which is the insulating layer SO1, in order to improve resistance to etching of this material by hot phosphoric acid.

Figure 8:
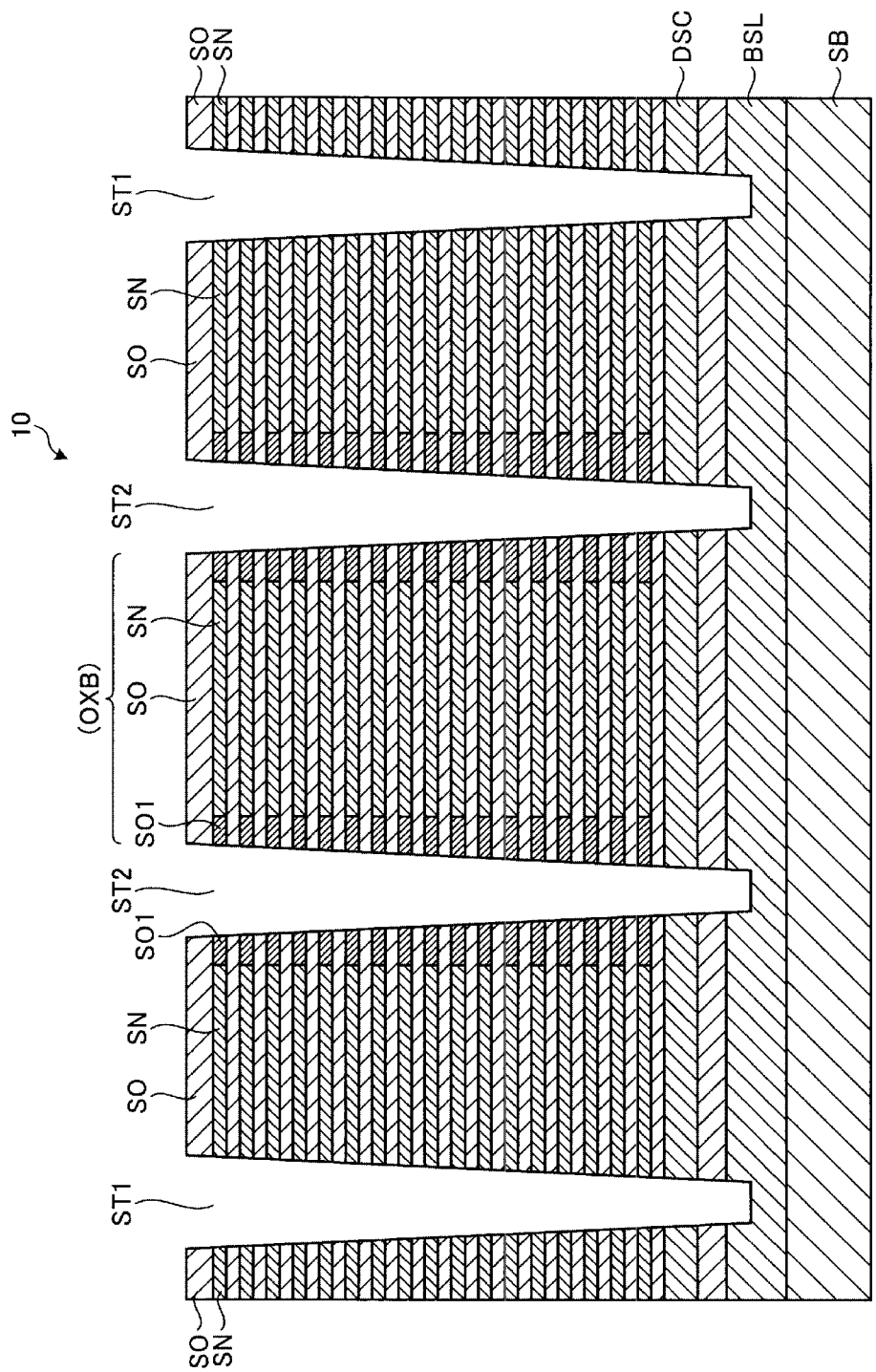
FIG. 8 depicts aspects of a method for producing a semiconductor storage device.

FIG. 8 depicts aspects of the method for producing the semiconductor storage device 10.

Then, as shown in FIG. 8, the insulating layer SO1 is removed by etching in such a way that the insulating layer SO1 formed on the surfaces of the sacrificial layers SN in the inner wall surfaces of the second slits ST2 remains.

This allows the sacrificial layers SN in the oxide-based region OXB to be protected by the insulating layer SO1 formed in the inner wall surfaces of the second slits ST2. When the sacrificial layers SN are etched by hot phosphoric acid or the like and are replaced with a conductive material such as tungsten later, the sacrificial layers SN in the oxide-based region OXB are not replaced with the conductive material and function as insulating layers.

This makes it possible to insulate the periphery of each contact C3 formed in the oxide-based region OXB. Then, the first slits ST1 and the second slits ST2 are filled with an insulating material such as silicon oxide.

As described above, according to the present embodiment, it is possible to increase the thickness of a side wall protective film which is formed when the oxide-based region OXB is formed and achieve sufficient resistance to phosphoric acid when the sacrificial layer SN is replaced with a conductive layer of tungsten or the like.

Moreover, since the protective film includes silicon oxide (SiO) of higher insulation quality than the silicon nitride (SiN) in the sacrificial layer SN, it is possible to achieve a better dielectric strength in the oxide-based region OXB.

In addition, it is possible to reduce the number of processes compared to existing processing to form a side wall protective film for the oxide-based region OXB by oxidation of a sacrificial layer SN and reduce production costs.

In general, the above-described embodiments dealt with a case in which the semiconductor storage device 10 includes just a one-tier stacked body. However, in other examples, the semiconductor storage device 10 may include more than one stacked body (multiple stacked tiers of memory cells or the like).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor storage device, comprising:
a stacked body stacked;
a memory pillar including a charge storage film; and
a contact, wherein the stacked body has a first stacked region in which a first insulating layer and a second insulating layer are alternately stacked on each other in a stacking direction and a second stacked region in which a conductive layer and the first insulating layer are alternately stacked on each other in the stacking direction, the memory pillar extends in the stacking direction through the second stacked region, the second insulating layer comprises a first insulating material within the first stacked region and a second insulating material on ends of the second insulating layer in a direction intersecting the stacking direction, and the contact is in the first stacked region, the contact contacting the first insulating material and extending through the first and second insulating layers in the stacking direction.

2. The semiconductor storage device according to claim 1, wherein the first insulating layer comprises silicon oxide, the second insulating material comprises silicon oxide, and the first insulating material is directly adjacent to the contact.

3. The semiconductor storage device according to claim 2, wherein the thickness of the second insulating material on an end of the second insulating layer is at least 15 nm in the direction perpendicular to the stacking direction.

4. The semiconductor storage device according to claim 1, wherein the thickness of the second insulating material between an end of the second insulating layer and the first insulating material is at least 15 nm in the direction intersecting the stacking direction.

5. The semiconductor storage device according to claim 1, wherein the first insulating layer comprises silicon oxide, and the second insulating material comprises silicon oxide.

6. The semiconductor storage device according to claim 5, wherein the first insulating material comprises silicon nitride.

7. The semiconductor storage device according to claim 1, wherein the thickness of the second insulating material in a direction intersecting the stacking direction is at least 15 nm.

8. The semiconductor storage device according to claim 7, further comprising:

an insulator in a slit in the stacked body between the first stacked region and the second stacked region.

9. The semiconductor device according to claim 8, wherein the slit has sidewalls which are inclined with respect to the stacking direction.

10. The semiconductor device according to claim 1, further comprising:

a substrate; and a peripheral circuit between the stacked body and the substrate, wherein the contact extends from an uppermost surface of the stacked body to the peripheral circuit.

11. A semiconductor storage device, comprising:

a peripheral circuit on a substrate and including a transistor;

a stacked body above the peripheral circuit, the stacked body having a first stacked region in which a first insulating layer and a second insulating layer are alternately stacked on each other in a first direction and a second stacked region in which a conductive layer and the first insulating layer are alternately stacked on each other in the first direction;

a memory pillar that extends in the first direction through the second stacked region; and a contact that extends in the first direction through the first stacked region to contact the peripheral circuit, wherein the memory pillar includes a charge storage film, the second insulating layer comprises a first-type insulating material within the first stacked region and a second-type insulating material on ends of the second insulating layer in a second direction intersecting the first direction, and the contact contacting the first-type insulating material.

12. The semiconductor device according to claim 11, wherein the first-type insulating material is silicon nitride and the second-type insulating material is silicon oxide.

13. The semiconductor storage device according to claim 11, wherein the thickness of the second-type insulating material in the second direction is at least 15 nm.

14. The semiconductor storage device according to claim 11, further comprising:

an insulator in a slit in the stacked body between the first stacked region and the second stacked region.

15. The semiconductor device according to claim 14, wherein the slit has sidewalls which are inclined with respect to the first direction.

16. The semiconductor device according to claim 11, wherein the peripheral circuit is between the stacked body and the substrate in the first direction.

17. A method for fabricating a semiconductor storage device, the method comprising:

forming a stacked body by alternately stacking a first insulating layer and a second insulating layer in a stacking direction;

forming a pillar and a columnar portion to pass through the stacked body;

forming a first slit in the stacked body and a plurality of second slits in the stacked body spaced from each other in a first direction intersecting the stacking direction;

forming a resist pattern that closes an opening of the first slit but does not close the openings of the plurality of second slits;

performing etching for forming a groove from which portions of the second insulating layer exposed by the plurality of second slits are removed such that an end face of the second insulating layer is recessed in the first direction with respect to an end face of the first insulating layer;

removing the resist pattern;

forming a protective film in the groove;

removing parts of the second insulating layer exposed through the first slit; and replacing the removed parts of the second insulating layer with a conductive material.

18. The method according to claim 17, further comprising:

forming a conductive contact through the first insulating layer and a remaining part of the second insulating layer.

* * * * *